(12) United States Patent
Tsai et al.

(10) Patent No.: US 6,404,646 B1
(45) Date of Patent: Jun. 11, 2002

(54) PC BOARD SUPPORT ADAPTED TO SUPPORT A PC BOARD ABOVE A FRAME IN A COMPUTER

(75) Inventors: Hsiang-Hsiang Tsai; Chao-Kun Chan, both of Taoyuan Hsien (TW)

(73) Assignee: Enlight Corporation (TW)

( * ) Notice: Subject to any disclaimer, the term of this patent is extended or adjusted under 35 U.S.C. 154(b) by 0 days.

(21) Appl. No.: 09/978,009

(22) Filed: Oct. 17, 2001

(51) Int. Cl.[7] .............................. H05K 7/14; H01B 17/02
(52) U.S. Cl. ...................... 361/758; 361/770; 361/769; 361/785; 361/787; 361/801; 361/807; 174/138 G
(58) Field of Search ........................... 361/742, 758–59, 361/770, 769, 785, 787–88, 796, 798, 801–804, 807–810; 403/229, 404, 405.1, 406.1, 407.1, 408.1; 174/138 G; 248/560

(56) References Cited

U.S. PATENT DOCUMENTS

| | | | | |
|---|---|---|---|---|
| 4,096,548 A | * | 6/1978 | Misono et al. ............... | 361/399 |
| 4,167,772 A | * | 9/1979 | Baehne ....................... | 361/399 |
| 5,402,320 A | * | 3/1995 | Kielstra et al. ............. | 361/796 |
| 5,956,835 A | * | 9/1999 | Aksu ........................... | 29/468 |
| 5,963,432 A | * | 10/1999 | Crowley ...................... | 361/804 |
| 6,140,591 A | * | 10/2000 | Osborne et al. ......... | 174/138 E |
| 6,308,394 B1 | * | 10/2001 | Boe ............................. | 20/450 |

* cited by examiner

Primary Examiner—Jayprakash N. Gandhi
Assistant Examiner—Dameon E. Levi
(74) Attorney, Agent, or Firm—Troxell Law Office PLLC

(57) ABSTRACT

A PC board support is disclosed to include a hollow support shell adapted to support a PC board above a frame, a spring mounted inside the support shell, the support shell having a top opening, a top neck, and a retainer head at the top of the top neck, and a slide supported on the spring inside the support shell and moved along a vertical sliding groove at the retainer head and top neck of the support shell in and out of the top opening to unlock/lock the PC board.

2 Claims, 5 Drawing Sheets

PC BOARD SUPPORT ADAPTED TO SUPPORT A PC BOARD ABOVE A FRAME IN A COMPUTER

BACKGROUND OF THE INVENTION

The present invention relates a PC board support adapted to support a PC board above a frame and, more particularly, to such a PC board support, which facilitates the installation of the PC board.

In the mainframe of a computer, upright female screws are fixedly provided at the topside of the frame, and screws are respectively mounted in respective through holes of the PC board and threaded into the female screws to fix the PC board to the frame. Because the screws must be respectively fastened to the female screws, it takes much time to install the PC board. There is known another PC board mounting arrangement in which the upright supports are fastened to the frame to support the PC board above the frame, each upright support having a split retaining bolt for fastening to a respective mounting hole in the PC board. It is also complicated to fasten the PC board to the split retaining bolts of the upright supports.

BRIEF DESCRIPTION OF THE INVENTION

The present invention has been accomplished to provide a PC board support, which eliminates the aforesaid drawbacks. It is the main object of the present invention to provide a PC board support, which makes the PC board support mounting and dismounting operations easy. According to one aspect of the present invention, the PC board support comprises a hollow support shell adapted to support a PC board above a frame, a spring mounted inside the support shell, the support shell having a top opening, a top neck, and a retainer head at the top of the top neck, and a slide supported on the spring inside the support shell and moved along a vertical sliding groove at the retainer head and top neck of the support shell in and out of the top opening to unlock/lock the PC board. According to another aspect of the present invention, the PC board is fastened to the upright support simply by: coupling the corresponding mounting hole of the PC board to the retainer head of the upright support shell, and then forcing the PC board downwards against the slide and the spring, and then pulling the PC board sideways into engagement with the neck of the support shell for enabling the slide to be forced upwards by the spring into engagement with the mounting hole of the PC board.

DETAILED DESCRIPTION OF THE PREFERRED EMBODIMENT

Figure 6:
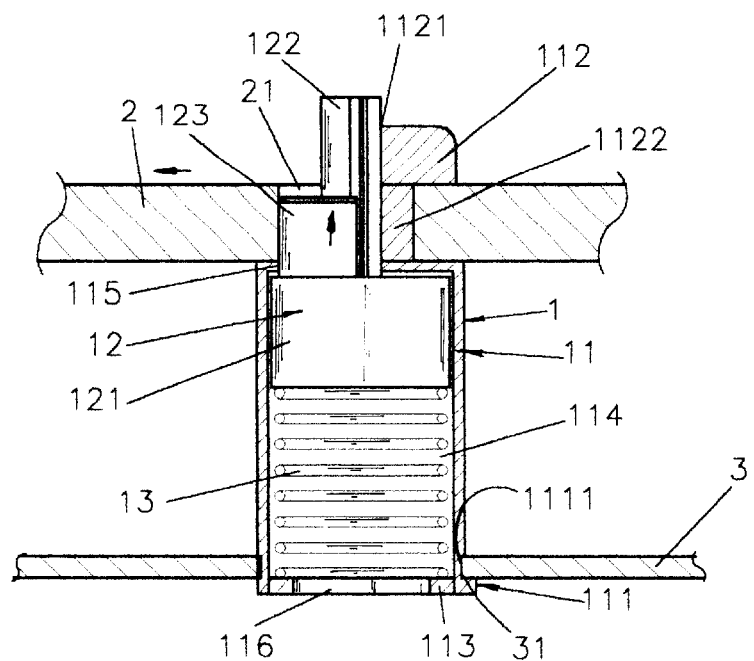
FIG. 6 is an installed view in section of the present invention.
Figure 7:
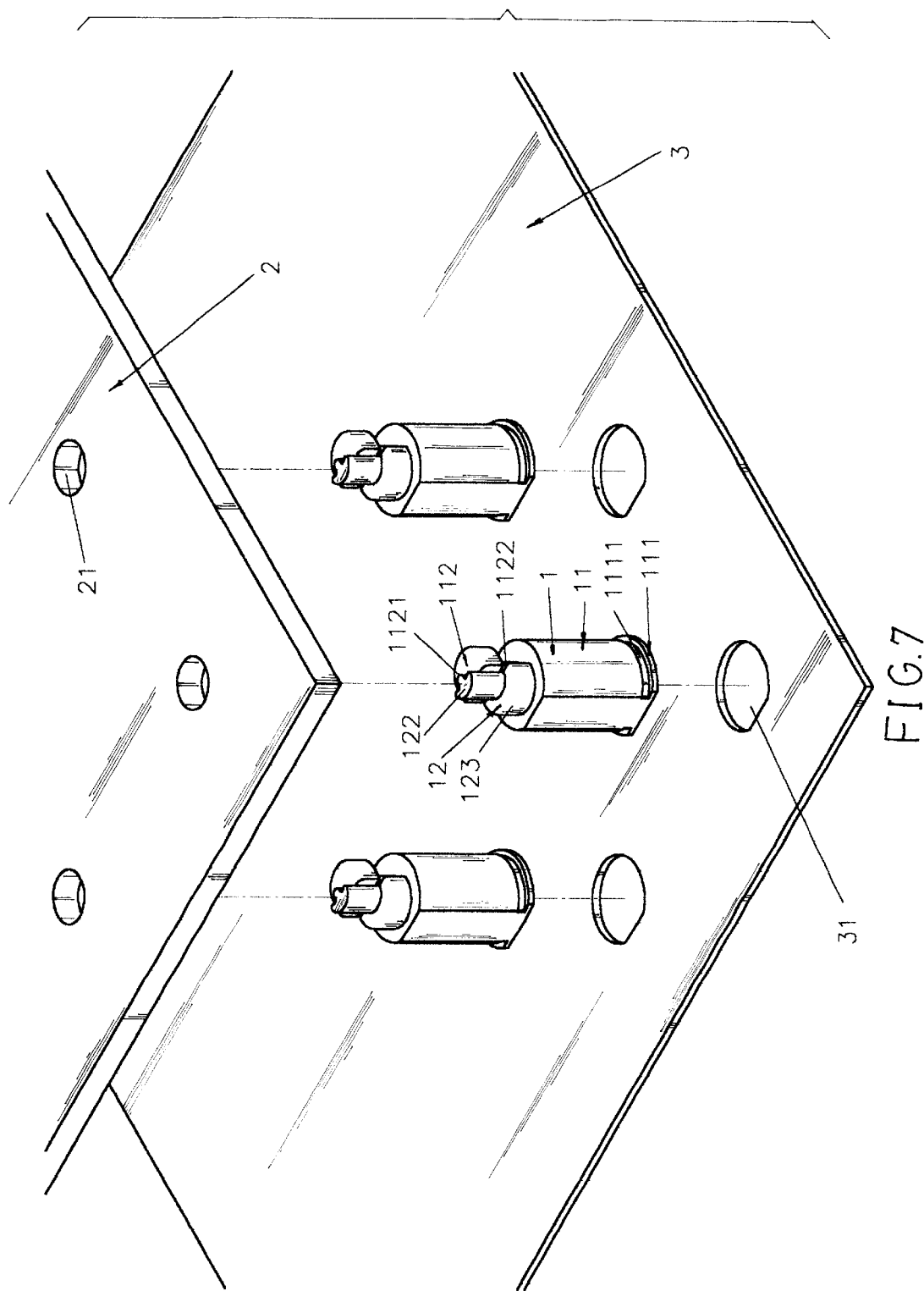
FIG. 7 is a perspective exploded view showing the positioning of PC board supports between the frame and the PC board according to the present invention.

Referring to FIGS. from 1 through 3 and FIGS. 6 and 7, a PC board support 1 is shown comprised of a hollow support shell 11, a slide 12, and a spring member 13.

The support shell 11 has a top opening 115 in the top sidewall thereof at an eccentric location, a bottom opening 116 in the bottom sidewall 13 thereof, an outward bottom flange 111 disposed around the periphery of the bottom side, an inside receiving chamber 114 in communication between the top opening 115 and the bottom opening 16, a coupling groove 1111 extended around the periphery close to the outward bottom flange 111 for engagement with the periphery of one mounting hole 31 of a frame 3, a vertical neck 1122 vertically upwardly extended from the top sidewall adjacent to the top opening 115, a retainer head 112 eccentrically formed integral with the top end of the vertical neck 1122, and a vertical sliding groove 1121 extended through the retainer head 112 and the vertical neck 1122 at one side in communication with the top opening 115. The slide 12 and the spring member 13 are mounted in the inside receiving chamber 114 of the support shell 11. The bottom sidewall 113 is formed by hammering a part of the peripheral wall of the support shell 11 inwards after insertion of the slide 12 and the spring member 13 into the inside receiving chamber 114 of the support shell 11. After formation of the bottom sidewall 13, the slide 12 and the spring member 13 are prohibited from escaping out of the inside receiving chamber 114.

The slide 12 comprises a base 121, a stop block 123 upwardly eccentrically extended from the base 121, and an upright rail 122 integral with one side of the stop block 123 and protruded over the topmost edge of the stop block 123. The diameter of the base 121 is greater than the top opening 115 so that the base 121 is prohibited from passing through the top opening 115. The area of the combined cross section of the stop block 123 and the upright rail 122 is not greater than the top opening 115 so that the stop block 123 and the upright rail 122 can be moved with the slide 12 in and out of the top opening 115 of the support shell 11. The upright rail 122 is coupled to the vertical sliding groove 1121 of the support shell 1, enabling the slide 12 to be moved partially in and out of the top opening 115 of the support shell 11. The spring member 13 is a compression spring 13 supporting the slide 12 in the inside receiving chamber 114 on the bottom sidewall 113 of the support shell 11.

Figure 1:
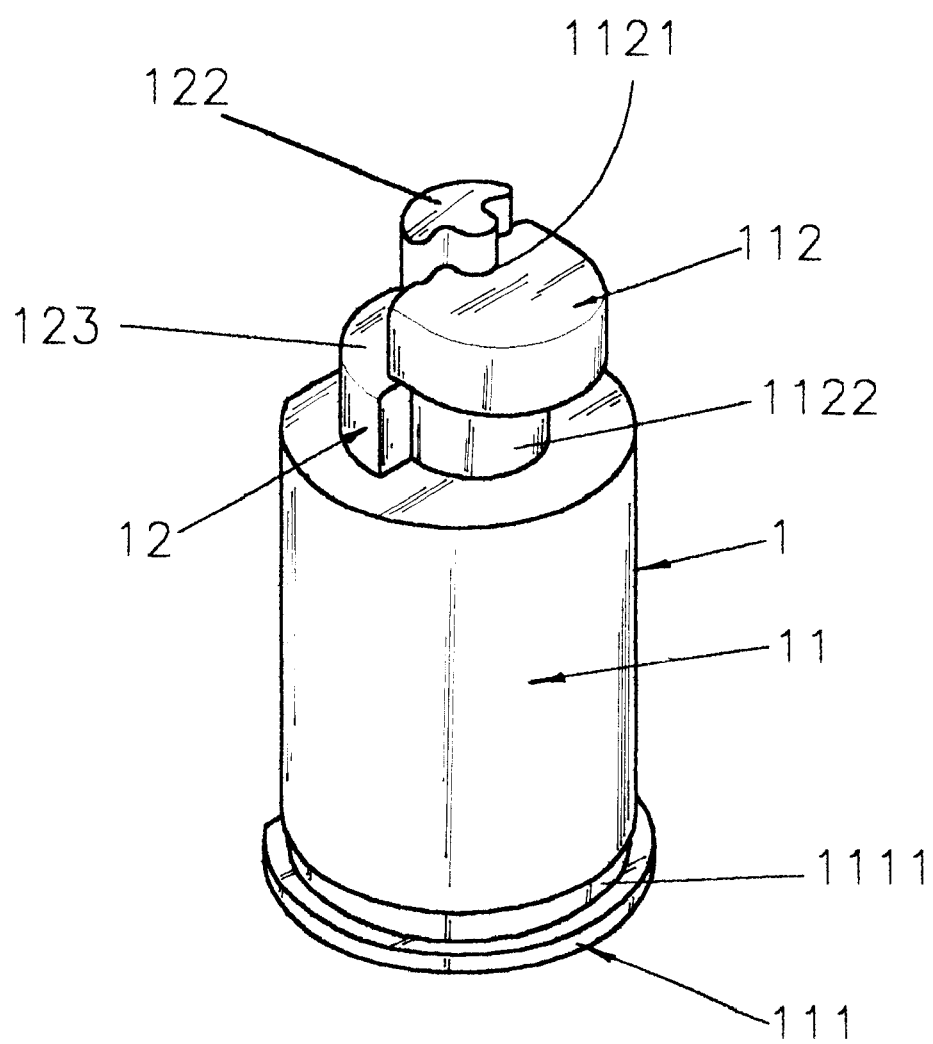
FIG. 1 is an elevational view of a PC board support according to the present invention.
Figure 2:
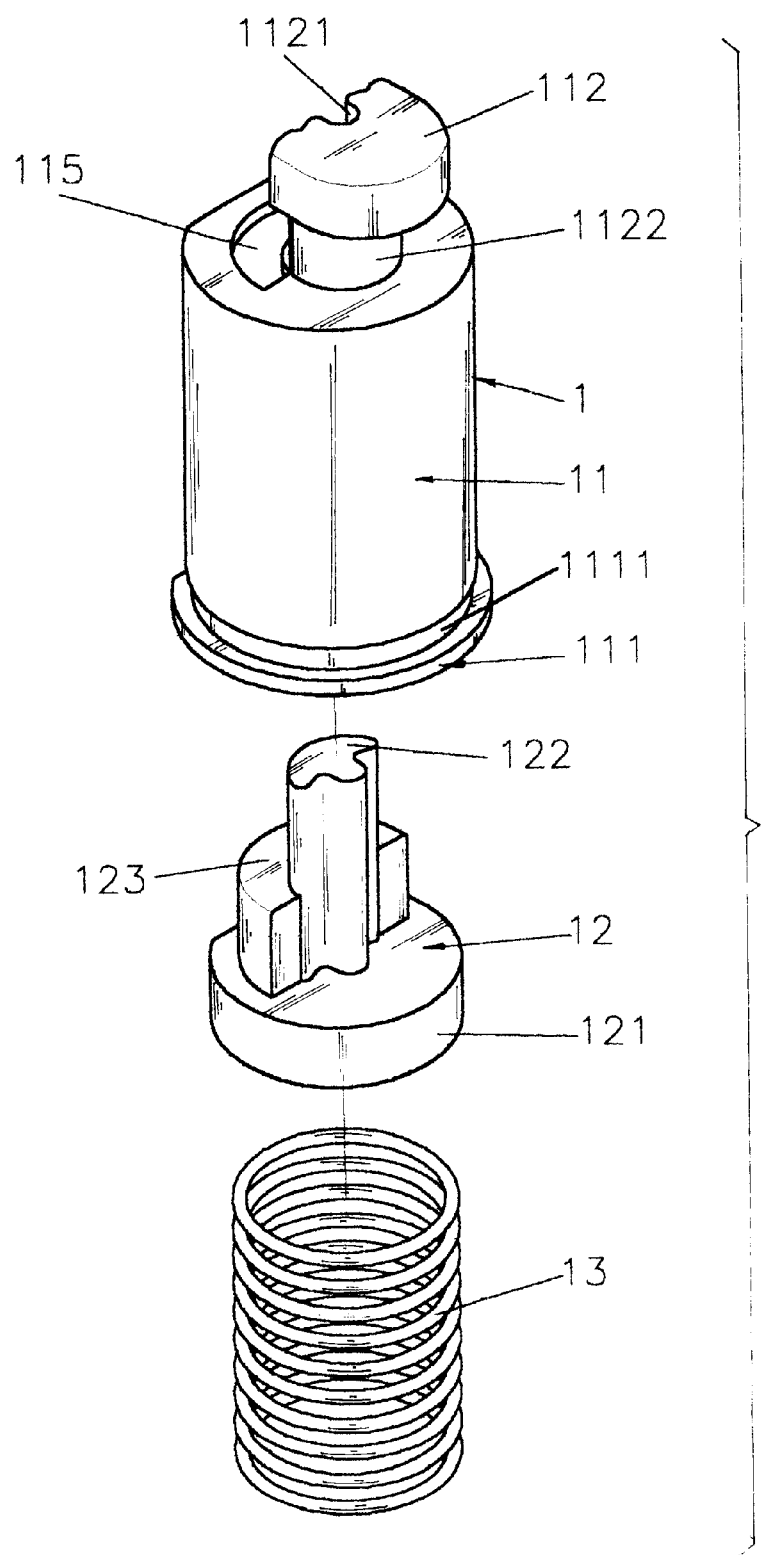
FIG. 2 is an exploded view of the PC board support according to the present invention.
Figure 3:
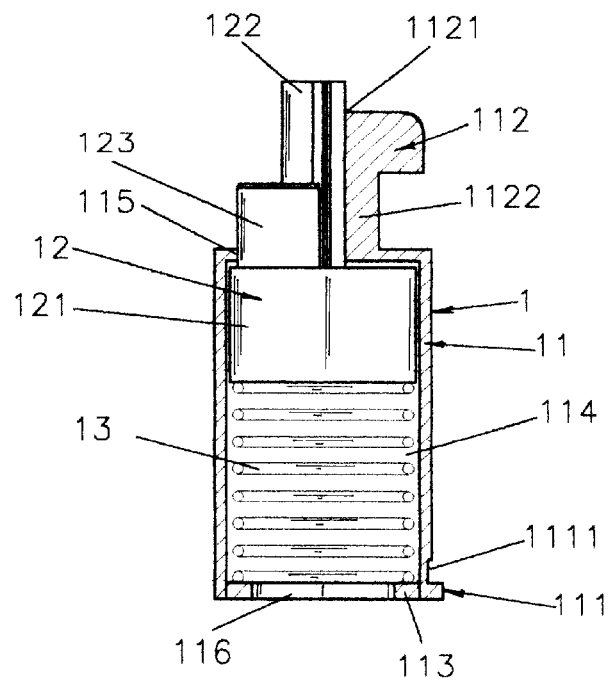
FIG. 3 is a sectional side view of the PC board support according to the present invention.
Figure 4:
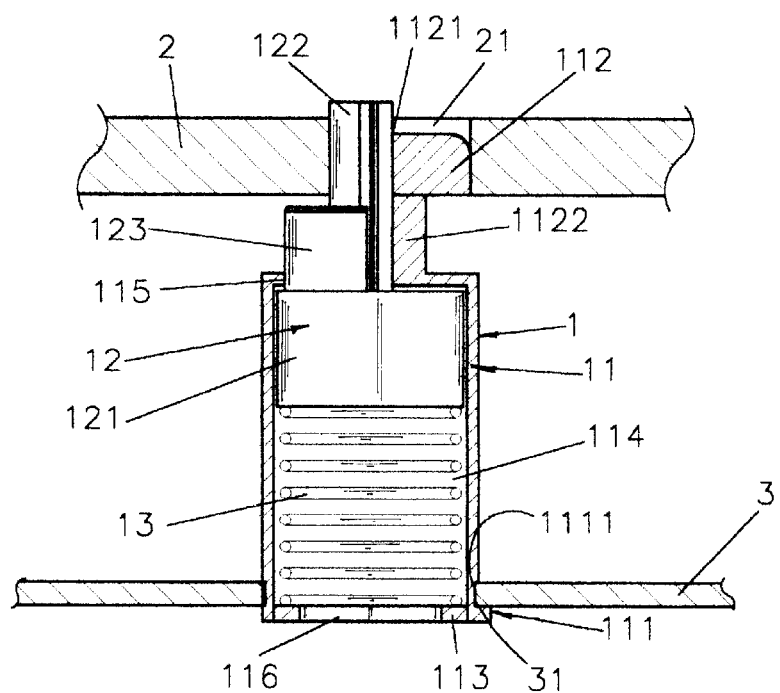
FIG. 4 is an installed view in section of the present invention (I).
Figure 5:
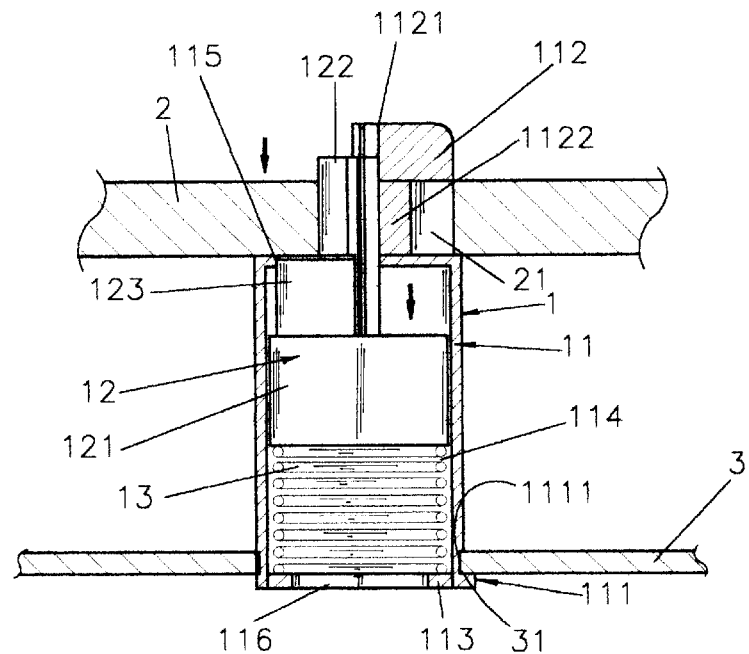
FIG. 5 is an installed view in section of the present invention (II).

Referring to FIGS. from 4 through 6, after the support shell 11 was fastened to the frame 3, the PC board 2 is attached to the support shell 11, enabling the retainer head 112 of the support shell 11 to be inserted through the corresponding mounting hole 21 of the PC board 2 (See FIG. 4). After the mounting hole 21 of the PC board 2 has been coupled to the retainer head 112 of the support shell 11, the PC board 2 is forced downwards and closely attached to the top sidewall of the support shell 11, and at the same time the stop block 123 is lowered with the slide 12 to the inside of the top opening 115 of the support shell 11 (see FIG. 5). Therefore after, the PC board 2 is moved horizontally in one direction for enabling the periphery of the mounting hole 21 to be forced into close contact with the periphery of the vertical neck 1122 of the support shell 11 (see FIG. 6). At this time, the stop block 123 is in perfect alignment with the top opening 15 of the support shell 11, and the spring member 13 immediately forces the slide 12 upwards, thereby causing the stop block 123 to be moved out of the top opening 15 of the support shell 11 into the mounting hole

21 of the PC board 2 to secure the PC board 2 in position (see FIG. 6), and therefore the PC board 2 is firmly secured to the PC board support 1.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A PC board support adapted to support a PC board above a frame, comprising:

a hollow support shell fastened to one mounting hole of a frame, said support shell comprising an inside receiving chamber, a top sidewall, a top opening eccentrically disposed in said top sidewall, an upright neck upwardly extended from said top sidewall, a retainer head eccentrically connected to a top side of said upright neck and spaced above said top sidewall, and a vertical sliding groove vertically extended through said retainer head and said vertical neck at one side in communication with said top opening;

a spring member mounted inside said inside receiving chamber of said support shell;

a slide supported on said spring member inside said inside receiving chamber of said support shell and adapted to be moved in and out of the top opening of said support shell to unlock/lock a PC board, which is coupled with a mounting hole thereof to the retainer head of said support shell, said slide comprising a base, a stop block upwardly eccentrically extended from said base, and an upright rail integral with one side of said stop block and protruded over the topmost edge of said stop block and coupled to the vertical sliding groove of said support shell for enabling said stop block to be moved with said slide in and out of said top opening of said support shell.

2. The PC board support as claimed in claim 1 wherein the combined cross section area of said stop block and said neck is not greater than the mounting hole of the PC board to be fastened to the PC board support is to be fastened, and the combined cross section area of said stop block and said retainer head is greater than the mounting hole of the PC board to be fastened to the PC board support.

* * * * *